United States Patent
Hyun et al.

(10) Patent No.: US 10,257,969 B2
(45) Date of Patent: Apr. 9, 2019

(54) ELECTROMAGNETIC WAVE SHIELDING STRUCTURE

(71) Applicant: LG INNOTEK CO., LTD, Seoul (KR)

(72) Inventors: Soon Young Hyun, Seoul (KR); Seok Bae, Seoul (KR); Hyung Yoon, Seoul (KR); Yong Jae Kwon, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/569,011

(22) PCT Filed: Apr. 22, 2016

(86) PCT No.: PCT/KR2016/004216
§ 371 (c)(1),
(2) Date: Oct. 24, 2017

(87) PCT Pub. No.: WO2016/171507
PCT Pub. Date: Oct. 27, 2016

(65) Prior Publication Data
US 2018/0132391 A1    May 10, 2018

(30) Foreign Application Priority Data
Apr. 24, 2015   (KR) .................... 10-2015-0058199

(51) Int. Cl.
*H05K 9/00* (2006.01)
(52) U.S. Cl.
CPC ......... *H05K 9/0088* (2013.01); *H05K 9/0026* (2013.01)
(58) Field of Classification Search
CPC ................... H05K 9/0088; H05K 9/0026

USPC ..................................... 361/816, 818
See application file for complete search history.

(56) References Cited

U.S. PATENT DOCUMENTS

| | | | |
|---|---|---|---|
| 6,818,821 B2 * | 11/2004 | Fujieda | B82Y 10/00 174/394 |
| 8,395,059 B2 * | 3/2013 | Miyazaki | H05K 9/0096 156/60 |
| 9,756,725 B2 * | 9/2017 | Jun | H05K 1/0326 |
| 9,832,914 B2 * | 11/2017 | Hyun | H05K 9/0024 |

(Continued)

FOREIGN PATENT DOCUMENTS

| KR | 10-2006-0089564 A | 8/2006 |
|---|---|---|
| KR | 10-2012-0024284 A | 3/2012 |

(Continued)

OTHER PUBLICATIONS

International Search Report in International Application No. PCT/KR2016/004216, filed Apr. 22, 2016.

*Primary Examiner* — Hung S. Bui
(74) *Attorney, Agent, or Firm* — Saliwanchik, Lloyd & Eisenschenk

(57) ABSTRACT

According to an embodiment, provided is an electromagnetic wave shielding structure comprising: a shielding structure encompassing an electromagnetic wave generation source, and having a surface roughness on a surface thereof; and an electromagnetic wave shielding metal layer arranged on the surface of the shielding structure so as to encompass the shielding structure, wherein the upper side and the lateral side of the shielding structure have different surface roughness.

3 Claims, 10 Drawing Sheets

(56) References Cited

U.S. PATENT DOCUMENTS

| | | | | |
|---|---|---|---|---|
| 2005/0045358 A1* | 3/2005 | Arnold | ............... | H05K 9/0024 |
| | | | | 174/51 |
| 2006/0272857 A1* | 12/2006 | Arnold | ............... | H05K 9/0024 |
| | | | | 174/377 |
| 2007/0009653 A1* | 1/2007 | Yamanaka | ............. | H01J 9/244 |
| | | | | 427/64 |
| 2011/0222218 A1* | 9/2011 | Kim | ..................... | H04N 5/645 |
| | | | | 361/679.01 |
| 2012/0051075 A1* | 3/2012 | Harada | ............... | H01L 33/508 |
| | | | | 362/510 |

FOREIGN PATENT DOCUMENTS

| KR | 10-1431613 B1 | 8/2014 |
|---|---|---|
| KR | 10-2014-0136743 A | 12/2014 |
| KR | 10-2015-0018382 A | 2/2015 |

* cited by examiner ness of each component is maximized and there are problems in that malfunction, performance degradation, and deterioration are caused by electromagnetic interference between adjacent components.
ELECTROMAGNETIC WAVE SHIELDING STRUCTURE

CROSS-REFERENCE TO RELATED APPLICATIONS

This application is the U.S. national stage application of International Patent Application No. PCT/KR2016/004216, filed Apr. 22, 2016, which claims priority to Korean Application No. 10-2015-0058199, filed Apr. 24, 2015, the disclosures of each of which are incorporated herein by reference in their entirety.

TECHNICAL FIELD

Embodiments of the present disclosure relate to a structure capable of efficiently shielding electromagnetic waves of electronic components.

BACKGROUND ART

Recently, as components in electronic products are integrated and a processing speed thereof is increased, performance of each component is maximized and there are problems in that malfunction, performance degradation, and deterioration are caused by electromagnetic interference between adjacent components.

To prevent a phenomenon of electromagnetic interference between adjacent electronic components and to improve performance thereof, electromagnetic interference (hereinafter referred to as EMI) shielding is implemented on a unit device that is functionally classified using a metal member or the like.

However, in the case of the metal member, there are problems of necessarily covering a wide area to cover a device that is to be covered, covering up to adjacent elements and an element irrespective of performance, and considering a height of the metal member, a thickness of a material of the metal member, and the like. In addition, since complete EMI shielding is very difficult, a phenomenon of an EMI leak occurs at a surface of a printed circuit board on which electronic components are equipped and a portion with which the metal member is engaged.

DISCLOSURE

Technical Problem

Therefore, it is an objective of the present disclosure to provide an electromagnetic wave shielding structure capable of minimizing performance degradation of an electronic component and a malfunction phenomenon by implementing a functional layer configured to shield electromagnetic waves inside the electromagnetic wave shielding structure to fundamentally block an electromagnetic interference (EMI) leak of the electromagnetic waves and efficiently realize electromagnetic wave shielding for various electronic components.

Technical Solution

To resolve the above-described problems, an electromagnetic wave shielding structure according to the embodiment includes an electromagnetic wave generation source configured to generate electromagnetic waves; a shielding structure configured to encompass the electromagnetic wave generation source, and having a surface roughness on a surface thereof; and an electromagnetic wave shielding metal layer configured to encompass the shielding structure, and having surface roughness corresponding to that of the shielding structure, wherein surface roughness of an upper side of the shielding structure is different from that of a lateral side of the shielding structure.

According to another one embodiment of the present disclosure, a surface roughness (Ra) of the lateral side of the shielding structure may be formed more finely than a surface roughness (Ra) of the upper side of the shielding structure.

According to still another one embodiment of the present disclosure, the surface roughness (Ra) of the upper side may be formed in a range of 1 µm to 30.0 µm.

According to yet another one embodiment of the present disclosure, the surface roughness Ra of the lateral side may be formed in a range of 0.1 µm to 10.0 µm.

According to still yet another one embodiment of the present disclosure, a thickness of the electromagnetic wave shielding metal layer may be formed in a range of 1 µm to 10 µm.

According to still yet another one embodiment of the present disclosure, surface roughness of the electromagnetic wave shielding metal layer may be formed by patterning two or more metal layers on inner surfaces of the upper side and the lateral side of the shielding structure.

According to still yet another one embodiment of the present disclosure, the electromagnetic wave shielding metal layer may be formed with a structure in which metal layers including at least one of Cu and Ni are stacked.

According to still yet another one embodiment of the present disclosure, an electroless Cu plating layer, an electrolytic Cu plating layer, and an electrolytic Ni plating layer may be stacked on the electromagnetic wave shielding metal layer.

Advantageous Effects

According to the embodiment of the present disclosure, there is an effect of being capable of minimizing performance degradation of an electronic component and a malfunction phenomenon by implementing a functional layer configured to shield electromagnetic waves inside an electromagnetic wave shielding structure to fundamentally block an electromagnetic interference (EMI) leak of the electromagnetic waves and efficiently realize electromagnetic wave shielding for various electronic components.

Specifically, a blister phenomenon or a side slipping phenomenon in which bubbles are generated on a surface of an electronic component occurring while a reliability test of the electronic component is performed may be removed by implementing the functional layer inside the electromagnetic wave shielding structure through a surface treatment structure and a plating layer, and a blocking rate of a lateral side of the electromagnetic wave shielding structure is maximized such that reliability can be increased.

MODES OF THE INVENTION

Figure 1:
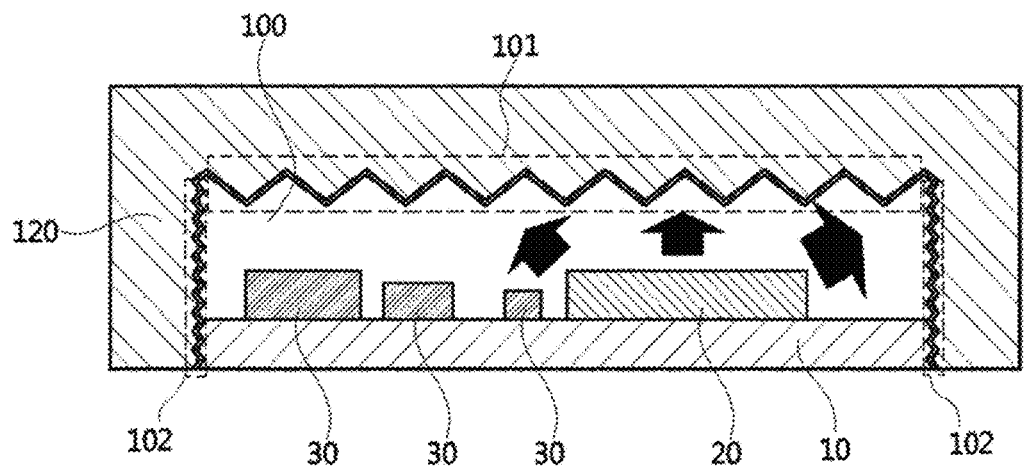
FIG. 1 is a conceptual diagram of a package to which an electromagnetic wave shielding structure according to an embodiment of the present disclosure is applied.

Hereinafter, preferred embodiments of the present disclosure will be described in detail with reference to the accompanying drawings. However, in the following description of the preferred embodiments, when a detailed description of a known related function or structure is determined to obscure the gist of the present disclosure, the detailed description thereof will be omitted. Also, a size of each component in the drawings may be exaggerated for explanation and does not refer to an actually applied size thereof.

Figure 2:
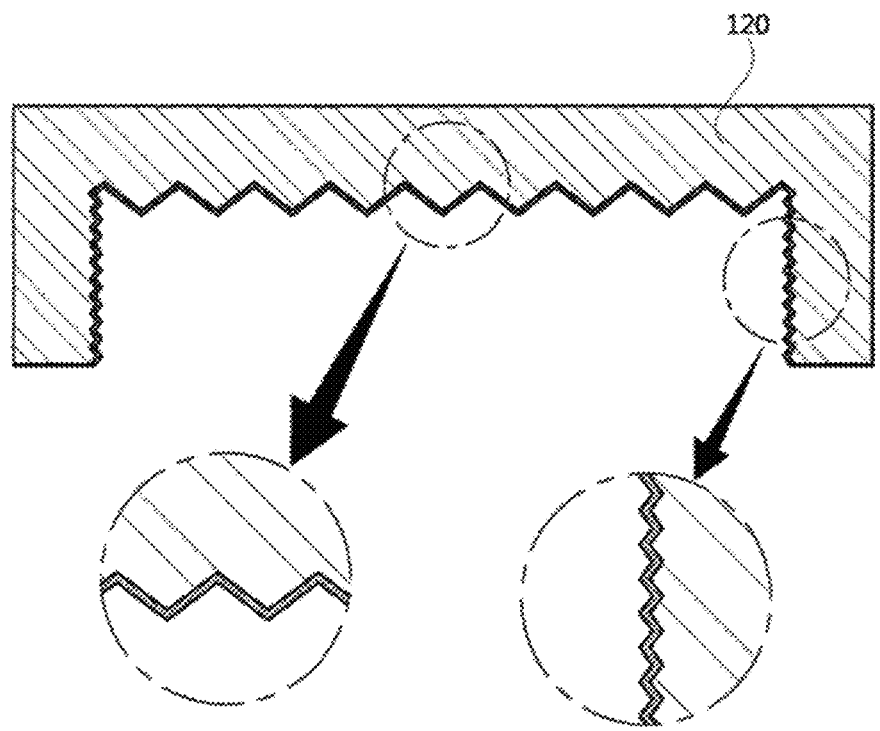
FIG. 2 is an enlarged conceptual diagram of the electromagnetic wave shielding structure of FIG. 1.

FIG. 1 is a conceptual diagram of a package to which an electromagnetic wave shielding structure according to an embodiment of the present disclosure is applied, and FIG. 2 is an enlarged conceptual diagram of the electromagnetic wave shielding structure of FIG. 1.

Referring to FIGS. 1 and 2, an electromagnetic wave shielding structure according to an embodiment of the present disclosure includes an electromagnetic wave generation source 20 configured to generate electromagnetic waves, a shielding structure 100 configured to encompass the electromagnetic wave generation source 20, and an electromagnetic wave shielding metal layer 120 configured to encompass the shielding structure 100.

The electromagnetic wave generation source 20 may be disposed on a printed circuit board 10, and adjacent elements 30 may be further disposed around the electromagnetic wave generation source 20.

At this point, the shielding structure 100 has a surface roughness on a surface thereof, and more particularly, the shielding structure 100 is configured with an upper side 101 and a lateral side 102 which have different surface roughnesses.

Specifically, the electromagnetic wave shielding metal layer 120 is configured such that a surface treatment is implemented on an inner surface of the shielding structure 100 by physical or chemical processing, and thus an adhesion failure, which results from inconsistency of a coefficient of thermal expansion (CTE) between materials, and a difference in surface energy therebetween, which may occur due to characteristics of heterogeneous materials between the surface of the shielding structure 100 and the electromagnetic wave shielding metal layer 120, may be removed to secure a surface area which sufficiently provides anchoring energy such that a blister phenomenon and a side shipping phenomenon may be eliminated.

In such a structure, a uniform film is also formed on the lateral side 102 to prevent a leak phenomenon of electromagnetic waves that are radiated in the lateral side 102 of the shielding structure 100 such that shielding performance is enhanced.

As shown in FIG. 1, the shielding structure 100 according to the embodiment of the present disclosure may be formed in a structure configured to entirely cover electronic components and electronic elements, which are various electromagnetic wave generation sources 20.

In this case, the electromagnetic wave generation source 20 is implemented to be equipped on a substrate such as the printed circuit board 10, and thus the shielding structure 100 is formed in a structure that is in close contact with the printed circuit board 10, and specifically, in this case, the electromagnetic wave shielding metal layer 120 is also formed at a close contact portion between the shielding structure 100 and the printed circuit board 10 such that leakage of electromagnetic waves may be blocked.

Specifically, the shielding structure 100 may be implemented to have a predetermined surface roughness through physical or chemical processing, and a thin film metal layer is formed on the inner surface having such a predetermined surface roughness through plating or the like such that the electromagnetic wave shielding metal layer 120 is formed.

Accordingly, the electromagnetic wave shielding metal layer 120 has a surface roughness corresponding to the predetermined surface roughness of the shielding structure 100.

In consideration of an influence of electromagnetic waves from the electromagnetic wave generation source 20 formed on the shielding structure 100, a surface roughness of the upper side 101 of the shielding structure 100 may be different from that of the lateral side 102 of the shielding structure 100.

That is, according to one embodiment of the present disclosure, a surface roughness Ra of the lateral side 102 of the shielding structure 100 or the electromagnetic wave shielding metal layer 120 may be less than that of the upper side 101, and, for example, a surface roughness Rb of the upper side may be 10 to 250 times the surface roughness Ra of the lateral side. More specifically, the surface roughness Ra of the upper side 101 of the shielding structure 100 may be formed in a range of 1 μm to 30.0 μm, and the surface roughness Ra of the lateral side 102 of the shielding structure 100 may be implemented in a range of 0.1 μm to 10.0 μm. When the surface roughnesses depart from the above-described ranges, a probability of a fault such as a blister phenomenon or a chipping phenomenon, which is a local scratch phenomenon occurring at an interface, occurring between the metal layer and the surface of the shielding structure 100 is significantly increased.

In addition, the surface roughness of the shielding structure 100 in the above-described embodiment of the present disclosure may be implemented by a method in which a surface treatment is performed on the surface of the shielding structure 100 through physical and chemical processing, and then the electromagnetic wave shielding metal layer 120 is implemented so that the surface roughness may be naturally transferred to the electromagnetic wave shielding metal layer 120. Alternatively, when the electromagnetic wave shielding metal layer 120 is formed on the inner surface of the shielding structure 100, a surface roughness treatment may be implemented by patterning the electromagnetic wave shielding metal layer 120.

Figure 3:
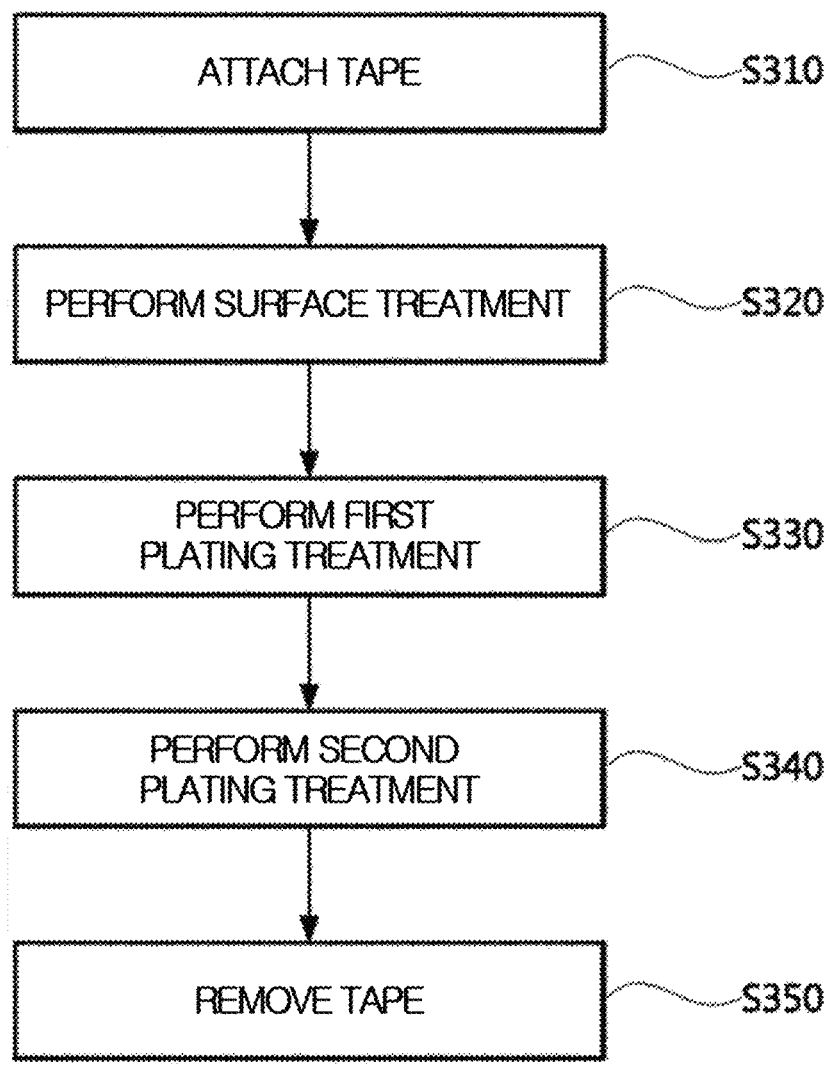
FIG. 3 is a flowchart illustrating fixation for implementing a surface roughness of a shielding structure according to an embodiment of the present disclosure.
Figure 4:
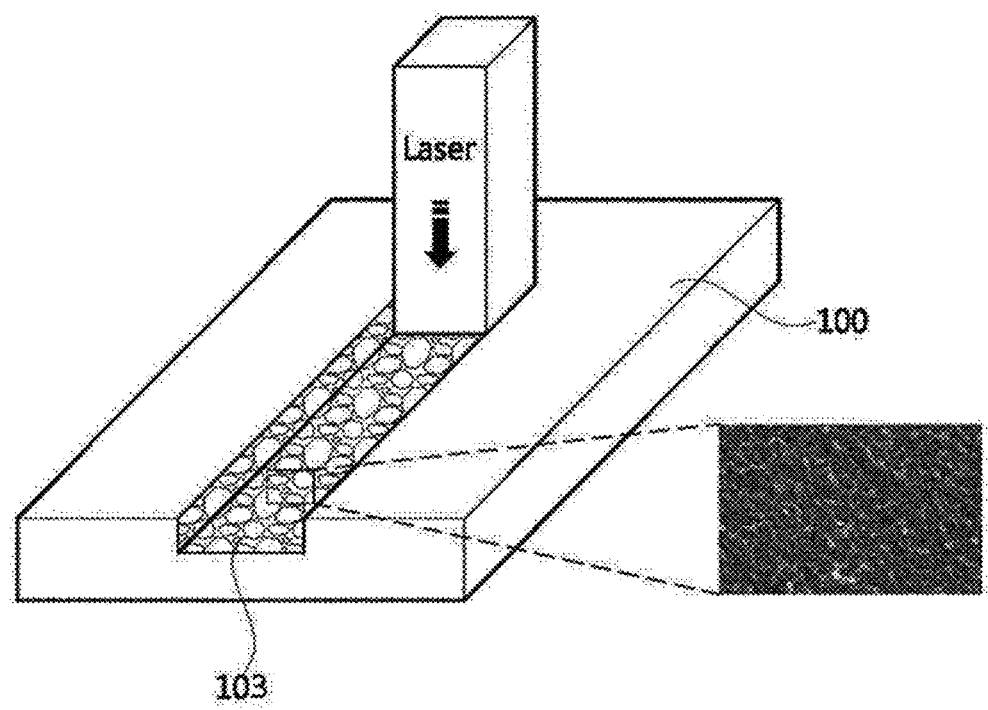
FIG. 4 is a diagram illustrating a method for implementing a surface roughness using a laser according to an embodiment of the present disclosure.
Figure 5:
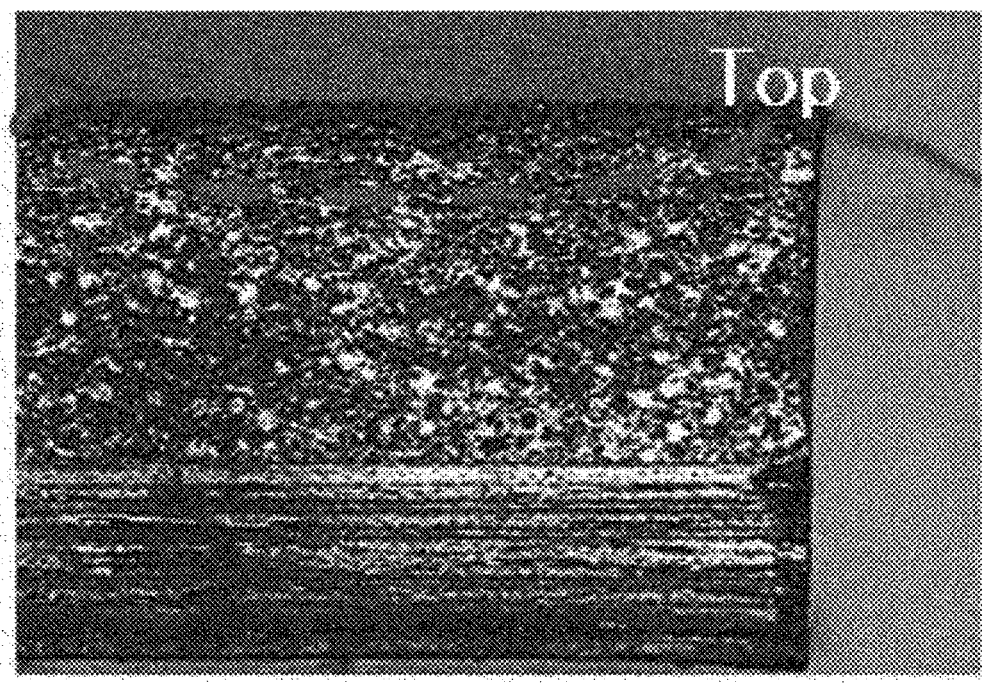
FIGS. 5 to 8 are cross-sectional views of an upper surface of the shielding structure of the embodiment of the present disclosure.
Figure 6:
Figure 7:
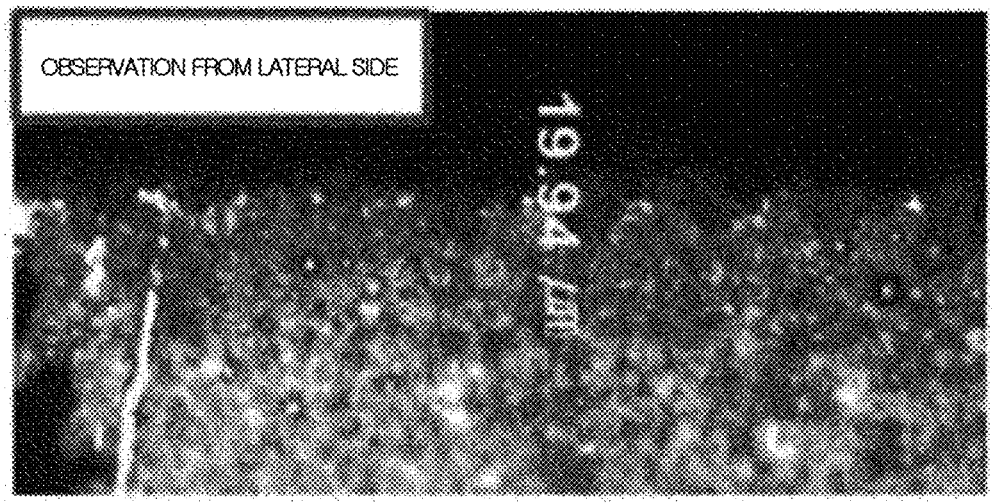
Figure 8:
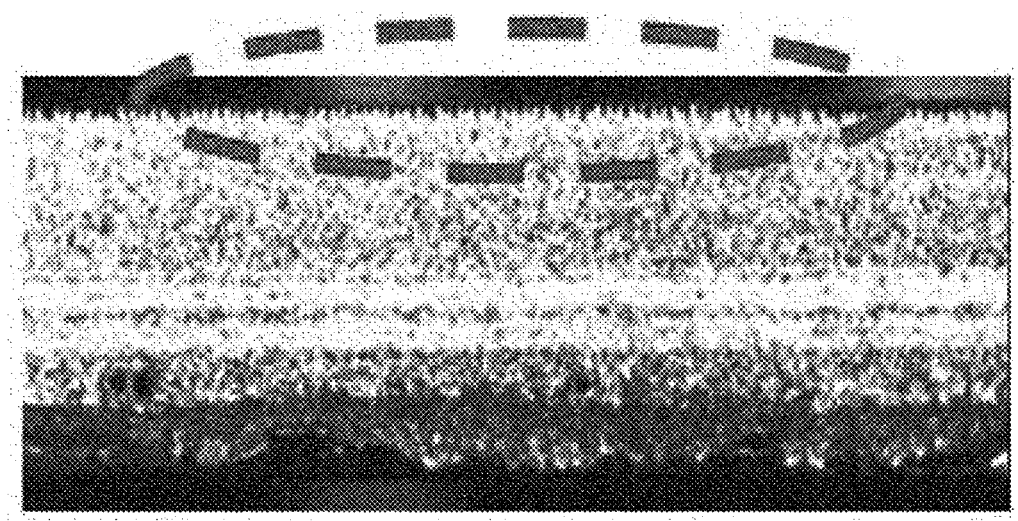

FIG. 3 is a flowchart illustrating a method for implementing the surface roughness of the shielding structure according to the embodiment of the present disclosure, and FIG. 4 is a diagram illustrating a method for implementing the surface roughness using a laser according to the embodiment of the present disclosure.

Figure 9:
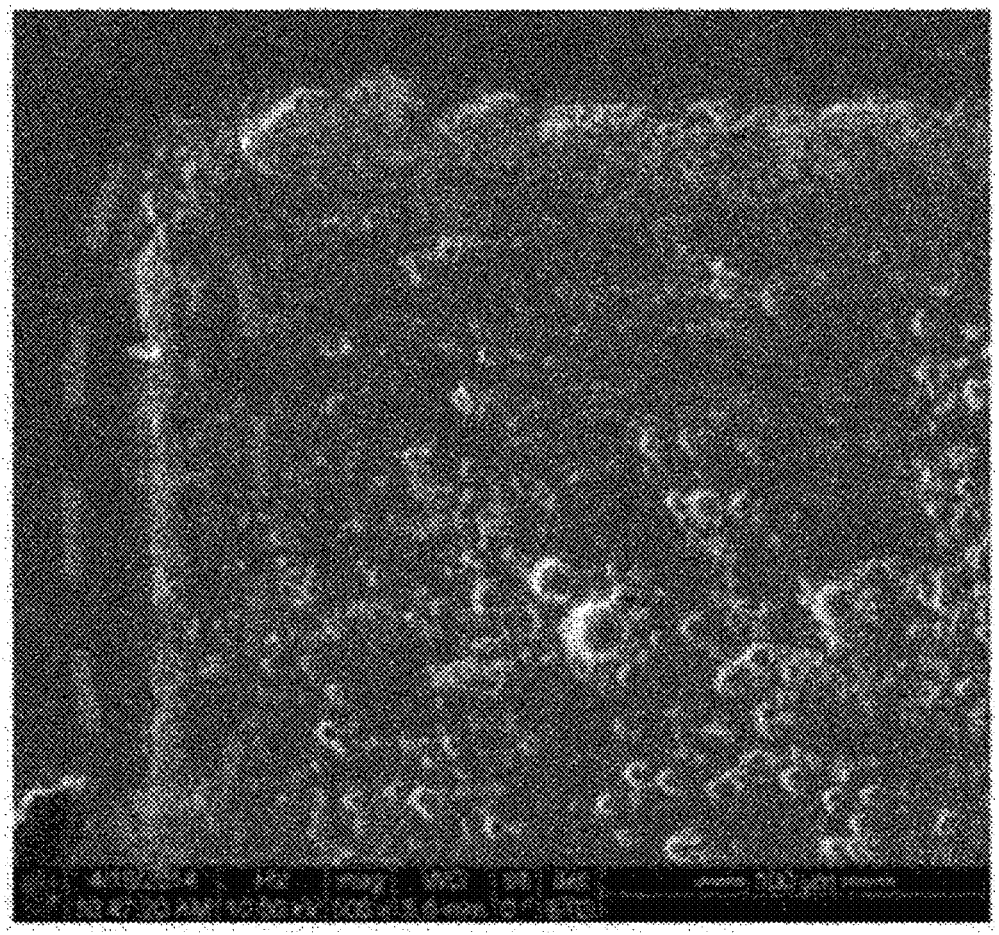
FIGS. 9 and 10 are cross-sectional views of a lateral side of the shielding structure of the embodiment of the present disclosure.
Figure 10:
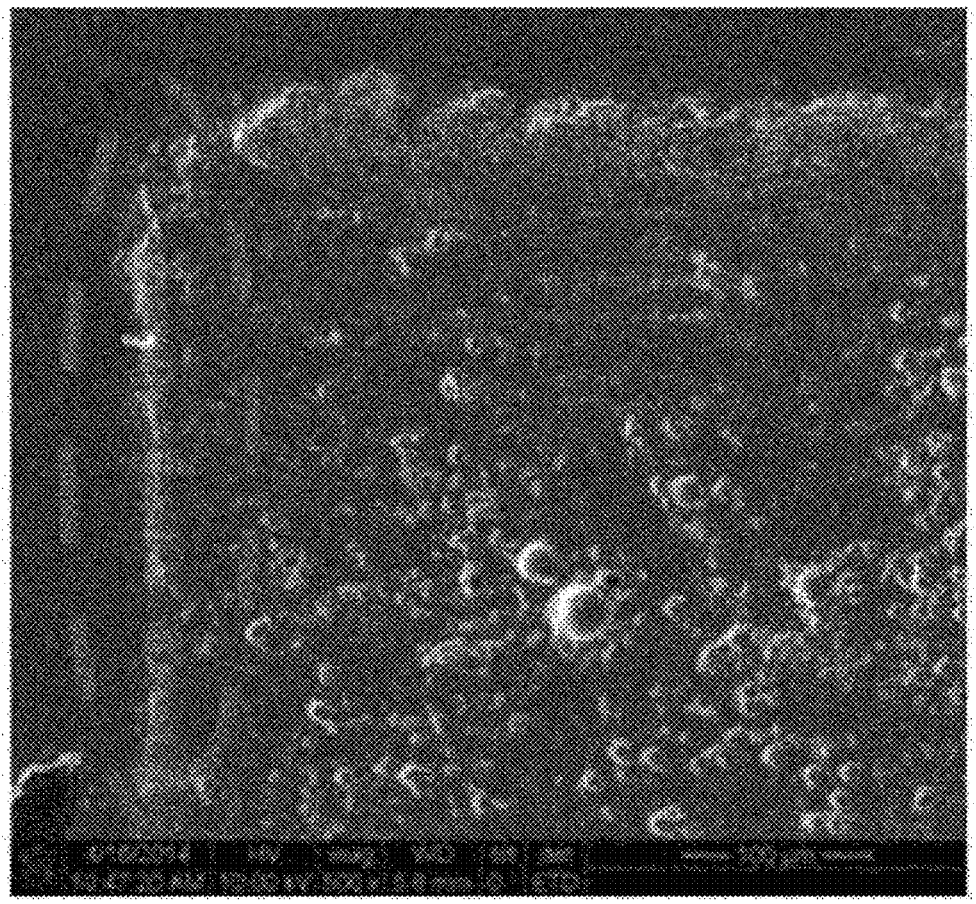

Also, FIGS. 5 to 8 are cross-sectional views of the upper surface 101 of the shielding structure of the embodiment of the present disclosure, and FIGS. 9 and 10 are cross-sectional views of the lateral side 102 of the shielding structure of the embodiment of the present disclosure.

Referring to FIG. 3, to realize an electromagnetic wave shielding metal layer having a surface roughness on the shielding structure according to the embodiment of the present disclosure, a foam tape is attached to the inner surface of the shielding structure to form an area for implementing the surface roughness (S310).

Thereafter, a surface treatment for implementing the surface roughness on the inner surface of the shielding structure is performed (S320). The surface treatment may be implemented using a physical surface treatment method after a chemical surface treatment method.

An example of the chemical surface treatment method may include swelling using glycol ether, etching using an etching solution such as $KMnO_4$, and neutralizing using an acidic liquid such as sulfuric acid or the like.

As shown in FIG. 4, a surface roughness 103 may be formed by irradiating the surface of the shielding structure 110 with a laser.

More specifically, a method for implementing the surface roughness using an electron beam (E-beam), an ultraviolet (UV) laser, or a $CO_2$ laser may be applied as the physical surface treatment method. For example, electron energy may be set to 30 keV, a diameter of the E-Beam may be set in a range of 30 μm to 50 μm, and an application time may be set in a range of 10 to 20 minutes to perform the method for implementing the surface roughness.

As shown in FIGS. 5 to 8, in the case of an inner surface of the upper side 101 of the shielding structure, the surface roughness Ra may be formed in a range of 1 μm to 30.0 μm, and as shown in FIGS. 9 and 10, in the case of an inner surface of lateral side 102, the surface roughness Ra may be formed in a range of 0.1 μm to 10.0 μm.

When the surface roughnesses depart from the above-mentioned ranges, a defect rate due to the blister phenomenon may be significantly high.

After the forming of the surface roughnesses, a metal layer may be implemented through a first plating treatment (S330). In this case, the metal layer forms a first metal layer (for example, a Cu metal layer) through electroless plating, and a surface of the Cu metal layer may be formed to have increased adhesive strength and also a constant surface roughness due to the surface roughness of the surface of the shielding structure.

Thereafter, stacking of two or more layers on the above-described first metal layer may be performed through a second plating treatment (S340). The metal layers may be implemented with a structure in which metal layers of Cu and Ni are stacked on the first metal layer using an electrolytic plating method.

Thereafter, the foam tape is removed to terminate the process (S350). When the foam tape is removed, there is an advantage of being capable of significantly reducing an occurrence of burrs at an interface of a contact metal layer.

In the above-described process, when a thickness of the electromagnetic wave shielding metal layer in the embodiment of the present disclosure is implemented in a range of 1 μm to 12 μm, efficiency of a shielding rate may be increased about 250% in comparison to that of a shielding rate without the electromagnetic wave shielding metal layer.

Figure 11:
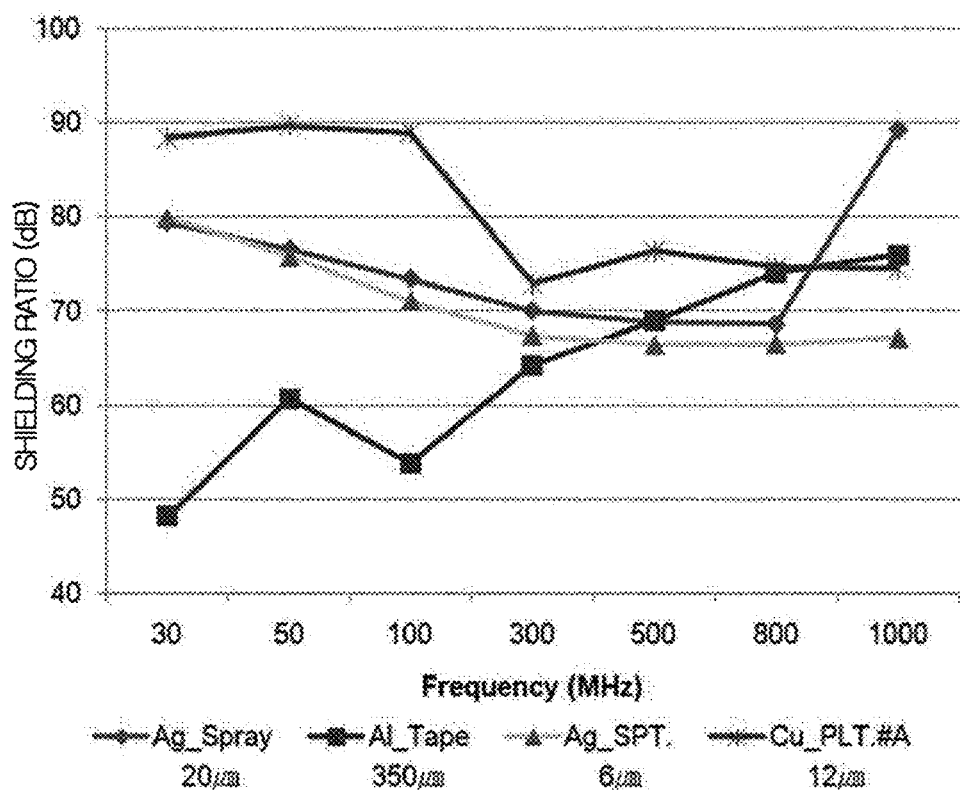
FIG. 11 is an experimental graph of shielding efficiency according to a thickness of an electromagnetic wave shielding metal layer in the embodiment of the present disclosure.

FIG. 11 is an experimental result of shielding efficiency for electromagnetic waves in a low frequency band in a range of 30 MHz to 1 GHz when a thickness of the electromagnetic wave shielding metal layer is implemented with 12 μm of an electrolytic Cu plating layer, a surface roughness of the upper side 101 of the shielding structure is in a range of 1 μm to 7.0 μm and an average of 5 μm, and a surface roughness of the lateral side 102 is in a range of 0.01 μm to 3.0 μm and an average of 2 μm in the embodiment of the present disclosure.

The shielding efficiency is compared to that of a comparative example in which a Ag metal layer is implemented with a thickness of 20 μm using a spraying process, an Al tape is implemented with a thickness of 350 μm, and Ag is implemented with a thickness of 6 μm using SPT. As a result, it can be seen that the example in which the electroless Cu plating layer of the present disclosure is implemented with a thickness of 12 μm has high shielding efficiency (about 4 dB and an improvement of 250%) over an entire frequency range.

Figure 12:
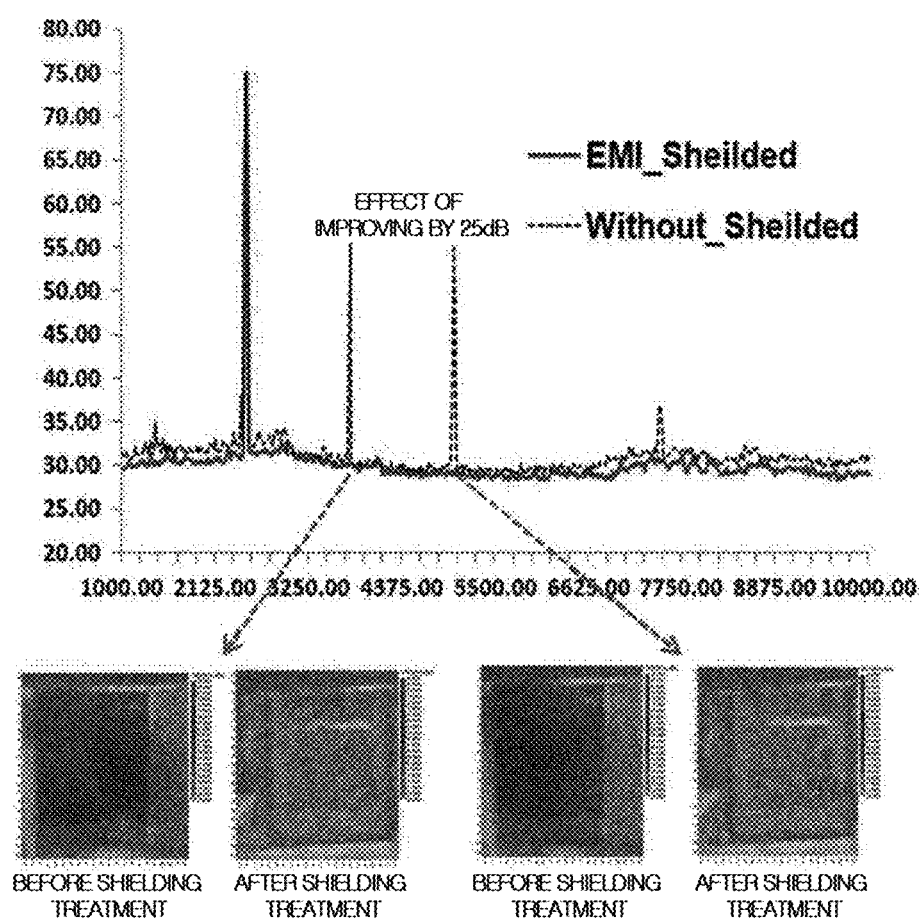
FIG. 12 is an experimental graph of electromagnetic wave shielding efficiency in a high frequency band in a range of 1 gigahertz (GHz) to 10 GHz in a shielding structure identical to that shown in FIG. 11.

FIG. 12 illustrates an experimental result for electromagnetic wave shielding efficiency of a shielding structure identical to that shown in FIG. 11 in a high frequency band in a range of 1 GHz to 10 GHz, and is a graph illustrating a comparison of the shielding efficiency of the shielding structure identical to that shown in FIG. 11 with that of the comparative example in which the metal layer is not implemented.

It can be seen that an improvement effect of shielding efficiency of about 25 dB occurs in the shielding structure according to the embodiment of the present disclosure over the entire frequency range.

Practical exemplary embodiments have been described in the preceding detailed description of the present disclosure. However, various modifications may be made thereto without departing from the scope of the present disclosure. Therefore, the technical spirit of the present disclosure is not limited to the embodiments described herein, and the technical spirit should be determined not only by the appended claims but also by equivalents to which such claims are entitled.

The invention claimed is:

1. An electromagnetic wave shielding structure comprising:
   a shielding structure configured to encompass an electromagnetic wave generating source and having a surface roughness; and
   an electromagnetic wave shielding metal layer disposed on an inner surface of the shielding structure and configured to encompass the shielding structure,
   wherein a surface roughness of an upper side of the inner surface of the shielding structure is in a range of 1 μm to 7.0 μm and has an average of 5 μm,
   wherein a surface roughness of a lateral side of the inner surface of the shielding structure is in a range of 0.01 μm to 3.0 μm and has an average of 2 μm,
   wherein a surface roughness of the upper side is different from that of the lateral side,
   wherein the electromagnetic wave shielding metal layer has a structure in which metal layers comprised an electroless Cu layer having a thickness of 12 μm, and
   wherein the shielding structure has an electromagnetic wave shielding efficiency in a range of 70~90 dB for electromagnetic waves having a frequency band of 30 MHz to 1 GHz.

2. The electromagnetic wave shielding structure of claim 1, wherein a surface roughness of the electromagnetic wave shielding metal layer is formed by patterning the metal layers on the upper side and the lateral side of the inner surface of the shielding structure.

3. The electromagnetic wave shielding structure of claim 1, wherein the surface roughness of the lateral side and the surface roughness of the upper side are configured to correspond to the frequency band of electromagnetic waves to be blocked.

\* \* \* \* \*